United States Patent
Bourianoff et al.

(10) Patent No.: US 8,897,047 B2
(45) Date of Patent: Nov. 25, 2014

(54) ASSOCIATIVE MEMORY OSCILLATOR ARRAY

(71) Applicant: Intel Corporation, Santa Clara, CA (US)

(72) Inventors: George I. Bourianoff, Austin, TX (US); Dmitri E. Nikonov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 13/629,935

(22) Filed: Sep. 28, 2012

(65) Prior Publication Data

US 2014/0092664 A1 Apr. 3, 2014

(51) Int. Cl.
*G11C 27/00* (2006.01)

(52) U.S. Cl.
USPC .................. 365/45; 365/189.07; 365/233.11

(58) Field of Classification Search
USPC .................................. 365/45, 189.07, 233.11
See application file for complete search history.

(56) References Cited

U.S. PATENT DOCUMENTS

| | | | |
|---|---|---|---|
| 6,788,577 B2 * | 9/2004 | Mihara | 365/185.18 |
| 7,349,279 B2 * | 3/2008 | Tsern et al. | 365/222 |
| 7,433,249 B2 * | 10/2008 | Jung | 365/189.09 |
| 7,484,035 B2 * | 1/2009 | Yamaguchi | 711/103 |
| 7,813,216 B2 * | 10/2010 | Wuidart | 365/233.11 |
| 2005/0071114 A1 * | 3/2005 | Nehrig | 702/127 |

OTHER PUBLICATIONS

Itoh, et al., Star Cellular Neural Networks for Associative and Dynamic Memories, International Journal of Bifurcation and Chaos, 2004, 1725-1772, vol. 14, No. 5, World Scientic Publishing Company.
Hoppensteadt, et al., Canonical Neural Models, The MIT press, 2001, 1-7, Cambridge, MA.
Hoppensteadt, et al., Pattern Recognition Via Synchronization in Phase-Locked Loop Neural Networks, IEEE Transactions on Neural Networks, May 2000, 734-738, vol. 11, No. 3.
Corinto, et al., Weakly Connected Oscillatory Network Models for Associative and Dynamic Memories, International Journal of Bifurcation and Chaos, 2007, 4365-4379, vol. 17, No. 12, World Scientific Publishing Company.
Hoppensteadt, et al., Oscillatory Neurocomputers with Dynamic Connectivity, Apr. 5, 1999, 2983-2986, vol. 82, No. 14, The American Physical Society.
Pufall, et al., Electrical Measurement of Spin-Wave Interactions of Proximate Spin Transfer Nanooscillators, Aug. 25, 2006, 4 pages.

* cited by examiner

*Primary Examiner* — Pho M. Luu
(74) *Attorney, Agent, or Firm* — Trop, Pruner & Hu, P.C.

(57) ABSTRACT

An analog associative memory, which includes an array of coupled voltage or current controlled oscillators, matches patterns based on shifting frequencies away from a center frequency of the oscillators. Test and memorized patterns are programmed into the oscillators by varying the voltage or current that controls the oscillators. Matching patterns result in smaller shifts of frequencies and enable synchronization of oscillators. Non-matching patterns result in larger shifts and preclude synchronization of oscillators. The patterns may each include binary data and the pattern matching may be based on discrete shifts. The patterns may each include gray-scale data and the pattern matching may be based on continuously-varied shifts. Other embodiments are described herein.

20 Claims, 7 Drawing Sheets

ASSOCIATIVE MEMORY OSCILLATOR ARRAY

BACKGROUND

An associative memory (AM) classifies test patterns. An AM finds the closest match between a "test pattern" and a set ("codebook") of "memorized patterns" stored in a memory coupled to the AM. In the case of character recognition, for example, such a test pattern may be a somewhat obscured or fuzzy image of a "1" that is to be compared to more crisp memorized patterns of a "0", a "1", and a "2". A properly functioning AM will match the test pattern "1" with the memorized pattern "1" and avoid matching the test pattern with the memorized patterns "0" or "2". AM is applicable in many areas including image or speech recognition, biometric recognition, internet and database searching, event (threat) identification, medical diagnostics, and the like.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
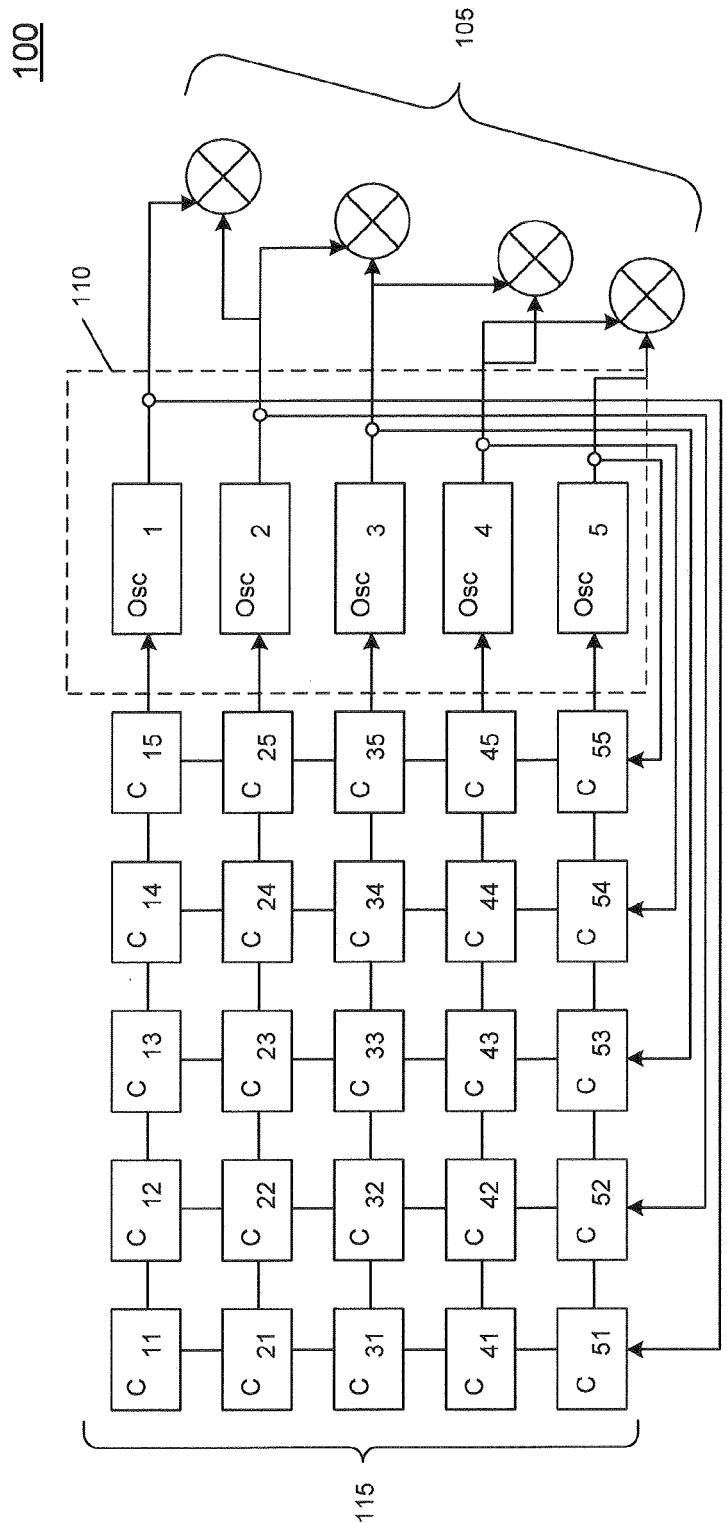
FIG. 1 includes a conventional AM system.

"An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

Software algorithms may be used for pattern recognition with general purpose digital hardware. However, the software/digital hardware method often proceeds with a sequential summation approach based on a bit-wise comparison between a test pattern and a memorized pattern (e.g., comparing pixel to pixel in test and memorized images). Doing so is computationally expensive and relatively slow.

Another option for pattern recognition relies on an array of coupled oscillators. Such oscillators include, for example, phase-locked loops (PLL), spin torque oscillators, and the like. Both the frequency and/or phase of these oscillators are voltage or current controllable. For example, FIG. 1 includes an architecture or system 100 based on a cross coupled array of oscillators 110. The operation of array 110 relies on encoding pattern information (e.g., bit information for a test pattern or memorized pattern) into coupling coefficients 115. In an embodiment, these coefficients might be determined by the state of a resistive memory (e.g. magnetic memory) at every node of the cross-connection array 115.

System 100 is a two-stage architecture. In the first stage (the initialization stage) array of oscillators 110 is connected to a cross-coupling array (having coefficients 115) in which coupling coefficients are set (i.e., programmed) according to a test pattern as follows: $C_{ij}(init)=\xi_{0i}\xi_{0j}^+$. Here the index i or j runs over the number of pixels in the pattern. As a result, the phases of oscillators 110 synchronize such that the relative phases between oscillators 110 encode to or are representative of the information in the test pattern. In other words, the phases and amplitudes for oscillators 110 start with arbitrary values and, with time, synchronize to relative phases of 0 or $\pi$ (plus or minus $2\pi$) according to the test pattern. Thus, after a transient time, one oscillator may synchronize to the test pattern by settling at 0, another settles at $\pi$, another settles at $-2\pi$, and so on. The phases lock and are stable. A white pixel may designate a 0 radian phase shift, and then a black pixel would designate a $\pi$ radian phase shift. The architecture is limited to black and white image matching and does not accommodate matching based on grayscale data.

In the second stage (the recognition stage) for system 100, coupling coefficients 115 are set according to the combination of m memorized patterns $\xi_{ki}$, enumerated by the index k, as follows $$C_{ij}(recog) = \frac{1}{m}\sum_{k=1}^{m} \xi_{ki}\xi_{kj}^+.$$

For that, array of oscillators 110 is connected to a different cross-coupling array, where the coupling coefficients are thus programmed. The array of oscillators collectively synchronizes to a pattern of relative phases corresponding to one of the m memorized patterns. In doing so, some of the phases of oscillators 110 "jump" and synchronize corresponding to the memorized pattern that is closest to the test pattern (because such a pattern is close in frequency to the test pattern). In other words, a few of the phases jump by $\pi$ radians to synchronize (phase lock by zero phase offset or some other steady phase offset multiple of $\pi$) according to the closest memorized pattern (e.g., to the "1" memorized pattern described in the Background section above). The degree of matching is the highest for the closest pattern (e.g., "1" memorized pattern) and smaller for other memorized patterns (e.g., "0" and "2" memorized patterns).

The architecture of FIG. 1, however, is limited and only finds a "winning pattern" after traversing the two stage protocol described above. This two stage traversal is time consuming and lacks ideal efficiency. Further, system 100 requires phase detectors, such as mixers 105, to measure the patterns in order to determine phase and whether there is indeed a match between two patterns. Also, system 100 needs an additional "winner localizer" stage to analyze the results from phase detectors 105 and identify which memorized pattern is the closest to the test pattern. Furthermore, system 100 needs memory cells that contain real numbers (between 1 and −1) to store coupling coefficients 115 during the second phase calculations (the recognition phase). Such memory cells are complicated and burdensome in their manufacture and use. Further still, many types of the oscillators (e.g., spin torque oscillators) have difficulty adequately controlling the phase of coupling between oscillators. Finally, system 100 only works with binary data patterns (rather than grayscale data) where a white square is "0", a black square is "1", and there is no in between.

An embodiment of the invention includes an analog associative memory, which includes coupled voltage or current controlled oscillators, that matches patterns based on shifting frequencies for non-matching patterns away from a center frequency while matching patterns phase lock with one another. The test and memorized patterns are programmed into the oscillators by varying the voltage or current that controls the oscillators. In one embodiment the patterns each include grayscale data and the pattern matching is based on the grayscale data. Other embodiments are described herein.

An embodiment includes analog parallel pattern matching that provides "winner localization" in a single computational stage.

An embodiment changes the manner of encoding information for AM operation. Instead of setting/programming coupling coefficients between oscillators (e.g., system 100 of FIG. 1), the embodiment instead shifts the frequency of oscillators by value $\Delta\omega$ according to a memorized pattern and a test pattern relative to the center frequency $\omega_0$ of oscillators.

Oscillators lock their phases to one another if their respective frequencies are close to one another. In contrast, oscillators do not lock their phases to one another if their respective frequencies are separated from one another by more than a threshold value, which is determined by the coupling strength. More specifically, whether two oscillators communicate depends on their frequencies. If two oscillators have nearly equal frequencies, they communicate such that the phase (timing) of one of them is sensitive to the phase of the other (and may migrate towards the other phase). In contrast, when the oscillators have essentially different frequencies their phases uncouple or at least never migrate towards one another.

In an embodiment of the invention, the shifts of the frequencies of the oscillators are set in such a manner that the resulting frequency is $\omega_i = \omega_0 + \Delta\omega(\xi_{0i} - \xi_{ki})$. In other words, if a pixel i is matching between a test pattern $\xi_{0i}$ and a memorized pattern $\xi_{ki}$, then the shift from the central frequency $CO_0$ is zero (or near zero in some embodiments) for the oscillator i.

Figure 2B:
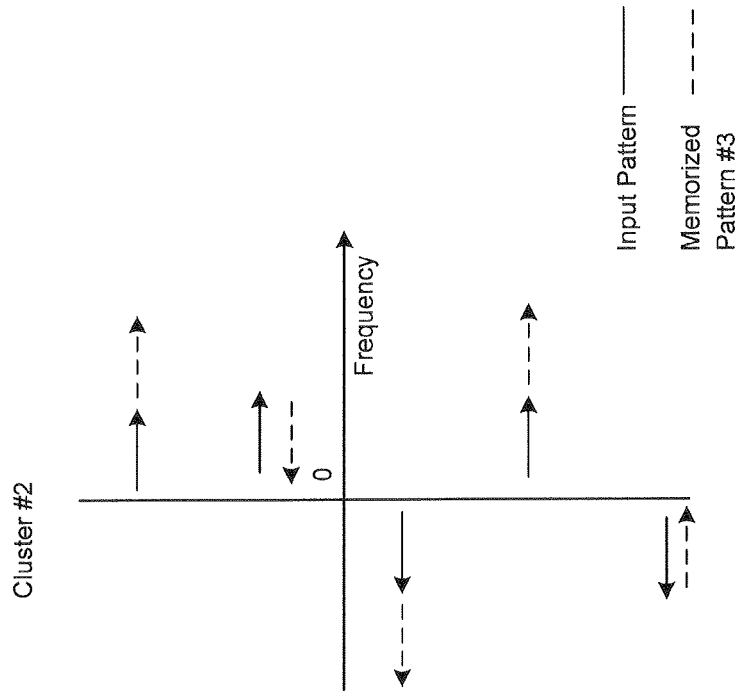
FIGS. 2(a) and 2(b) depict frequency shifting in the process of pattern matching in an embodiment of the invention.
Figure 2A:
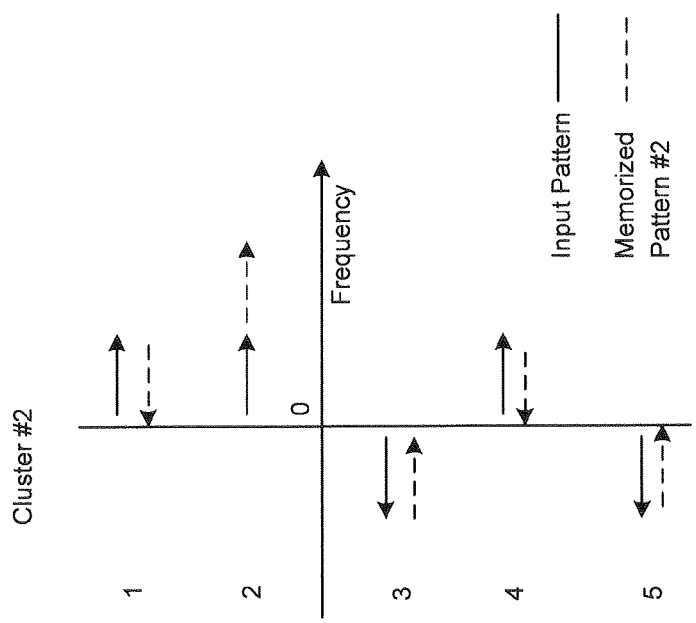
Figure 6A:
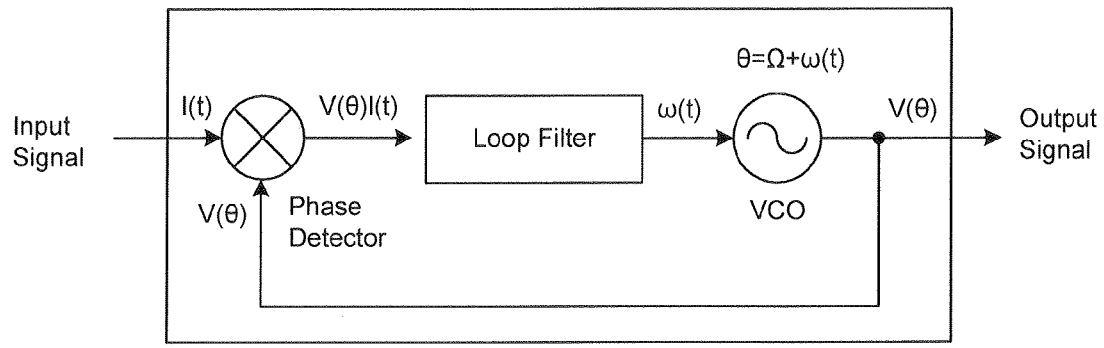
FIGS. 6(a) and 6(b) show oscillators for use in an embodiment of the invention.
Figure 6B:
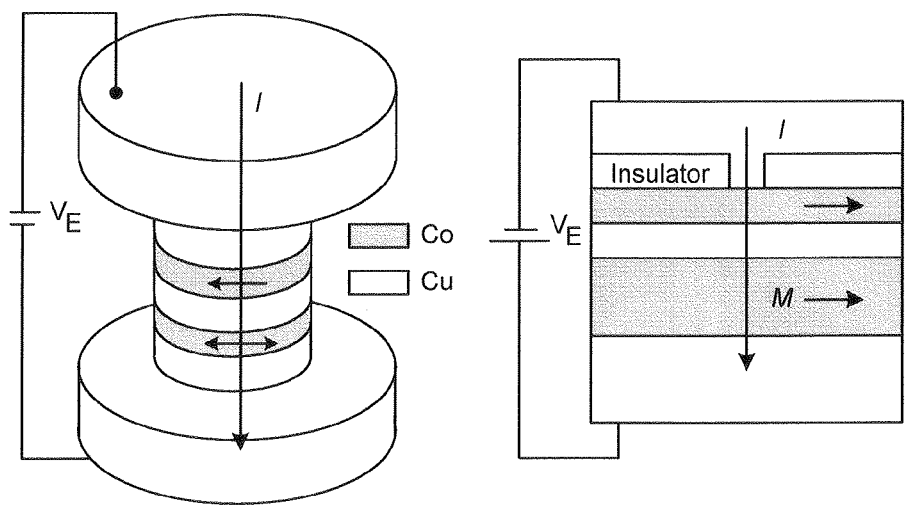

FIG. 2(b) shows that for non-matching patterns the resulting frequencies are mostly shifted away from the center frequency of the oscillators, while FIG. 2(a) shows that for closely matching patterns the resulting frequencies are mostly remaining near the center frequency. In one embodiment a separate AM cluster (i.e., array of oscillators) is used to determine the degree of match for each memorized pattern (index "m" as used herein) and for the test pattern. The frequency shifts are implemented via current or voltage controlled oscillators (e.g., such as a PLL (FIG. 6(a)), spin torque oscillator (FIG. 6(b)), resonant body oscillator, and the like) by relating the test and memorized patterns to constant voltage sources or constant current sources and connecting the sources to the controls of the oscillators. In other words, FIG. 2(a) includes data for five oscillators. Each oscillator may correspond to a pixel in a pattern. The five solid arrows near the center frequency $\omega_0$ of the oscillators correspond to five shifts proportional to the test pattern (e.g., see five oscillators of FIG. 3, which is discussed below). The five dashed arrows correspond to shifts proportional to the memorized pattern. Considering FIG. 2(a) shows a strong match to a memorized pattern, the solid and dashed arrows result in zero shifts for the majority of oscillators. They phase lock due to the similarity of their frequencies. Thus, because there is a match there is little frequency shifting. In other words, in keeping with $\omega_i = \omega_0 + \Delta\omega(\xi_{0i} - \xi_{ki})$, for four of the five oscillators there is no shift from $\omega_0$ because $(\xi_{0i} - \xi_{ki})$ is zero. Visually this is depicted in FIG. 2(a) by solid and dotted arrows facing in opposite directions thereby canceling each other out. In only one of the five oscillators do the two shifts not cancel each other out (i.e., $(\xi_{0i} - \xi_{ki})$ is not equal to zero). If each of the oscillators pertains to one portion of the test and model patterns (e.g., a pixel) then four of the five portions indicate very strong matching.

FIG. 2(b) also includes data (five sets of arrows) for five oscillators. The 5 solid arrows near the center frequency $\omega_0$ correspond to five shifts proportional to the test pattern. The five dashed arrows correspond to five shifts proportional to another memorized pattern. However, considering FIG. 2(b) shows a weak match to the memorized pattern, the dashed arrows for the memorized pattern do not cancel out the solid arrows of the test pattern (i.e., $(\xi_{0i} - \xi_{ki})$ is not equal to zero). Instead, mismatched frequencies are shifted away from the center frequency $\omega_0$ for three of the five oscillators where there is poor matching.

Figure 3:
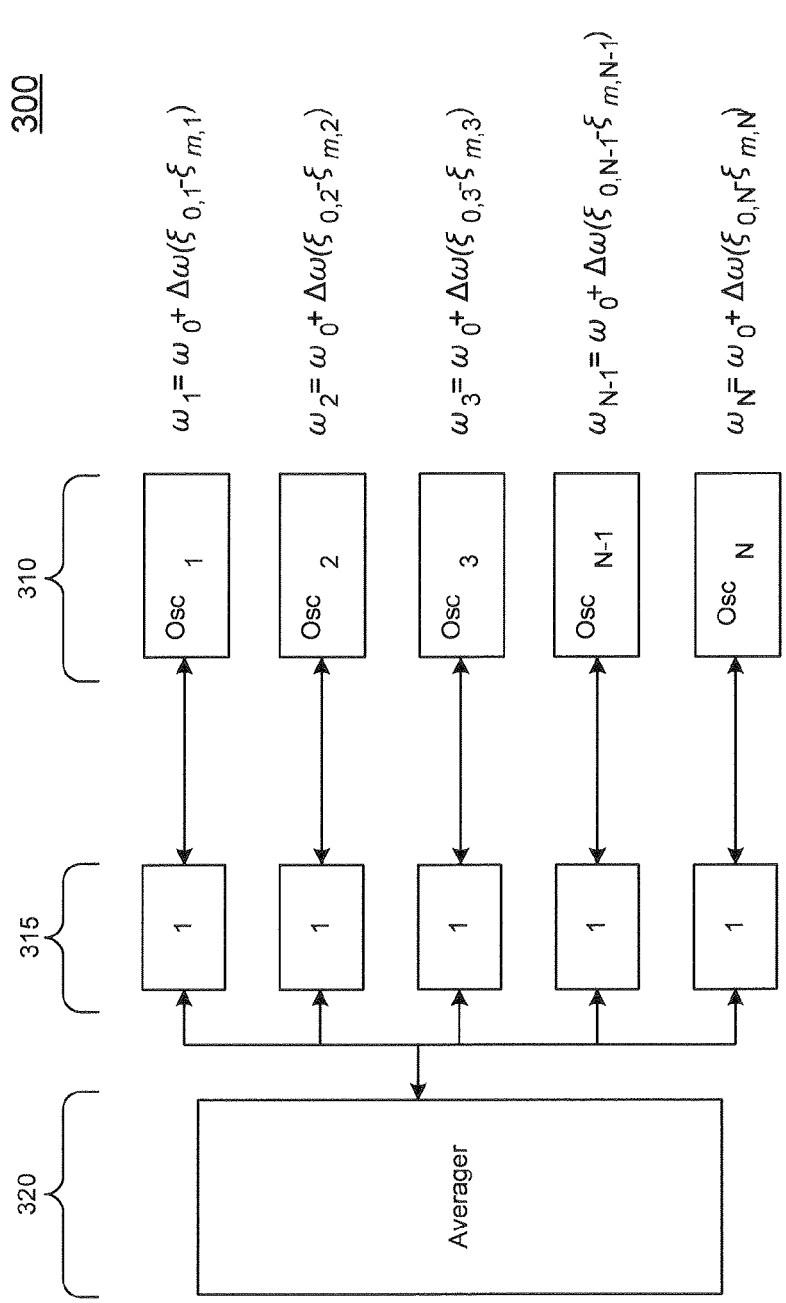
FIG. 3 includes an AM system in an embodiment of the invention.

FIG. 3 includes an embodiment where coupling coefficients 315 for oscillator array 310 are all set to equivalent constants (Cij=1) corresponding to an "all-to-all" connectivity. Oscillators 310 are connected to one another via a common node; "averager" module 320. In one embodiment, averager 320 is an operational amplifier (op-amp) that sums the respective outputs of each of oscillator of array 310 and broadcasts the sum back to the respective inputs of the oscillators. In one embodiment, the amplitude of time averaged voltage from averager 320 represents the degree of matching of the test pattern to the m-th memorized pattern. If the normalized complex amplitude of voltage output of oscillator i is designated as $z_i$, then the degree of matching ($d_k$) between the test pattern and a memorized pattern k determined by the averager is $$d_k = \frac{1}{n}\sum_{i=1}^{n} z_i.$$

In one embodiment, for closely matching patterns the amplitude may be close to 1, and for non-matching patterns the amplitude oscillates at values smaller than 1.

Regarding the equations shown in FIG. 3, one such equation is now described and is representative of the remaining equations of FIG. 3. A first oscillator ($Osc_1$) calculates phase according to: $\omega_1 = \omega_0 + \Delta\omega(\xi_{0,1} - \xi_{m,1})$. This shows how output $\omega_1$ is based on the sum of the center frequency $\omega_0$ and frequency shift. $\Delta\omega$ is a constant. In one embodiment, $\omega_0$ 0 GHz and $\Delta\omega=1$ GHz but in other embodiments the constants may be $\omega_0=1$ to 40 GHz and $\Delta\omega=0.1$ to 8 GHz. Each oscillator produces a similar output, which is then handled by averager 320 as described above.

In an embodiment the target and memorized patterns do not need to correspond to binary values of phases (i.e., 0 or π). Instead, they can be arbitrary real numbers and represent grayscale patterns. Thus, the portions of a pattern do not need to be binary data patterns where a white square is "0", a black square is "1", and there is no in between. Instead, intermediate values between white and black are handled by the analog system such as system 300 of FIG. 3.

While FIG. 3 shows five oscillators, such a limited number is possible in an embodiment but is merely shown to discussion purposes. Other embodiments may include vast arrays of oscillators with different groups or clusters of oscillators dedicated or assigned to different memorized patterns and the like.

Figure 4A:
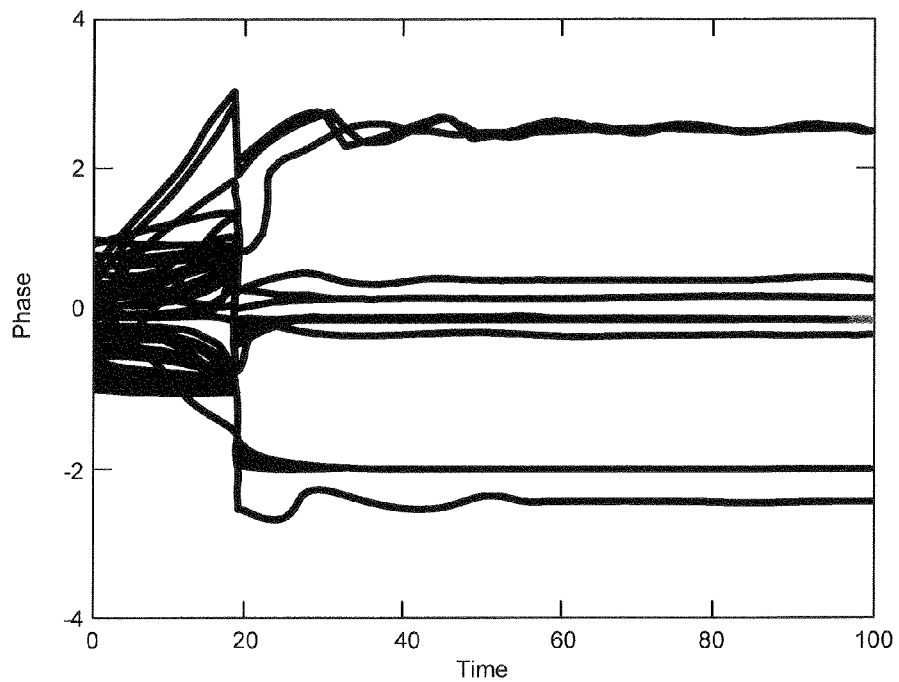
FIGS. 4(a) and 4(b) depict pattern matching in an embodiment of the invention.
Figure 4B:
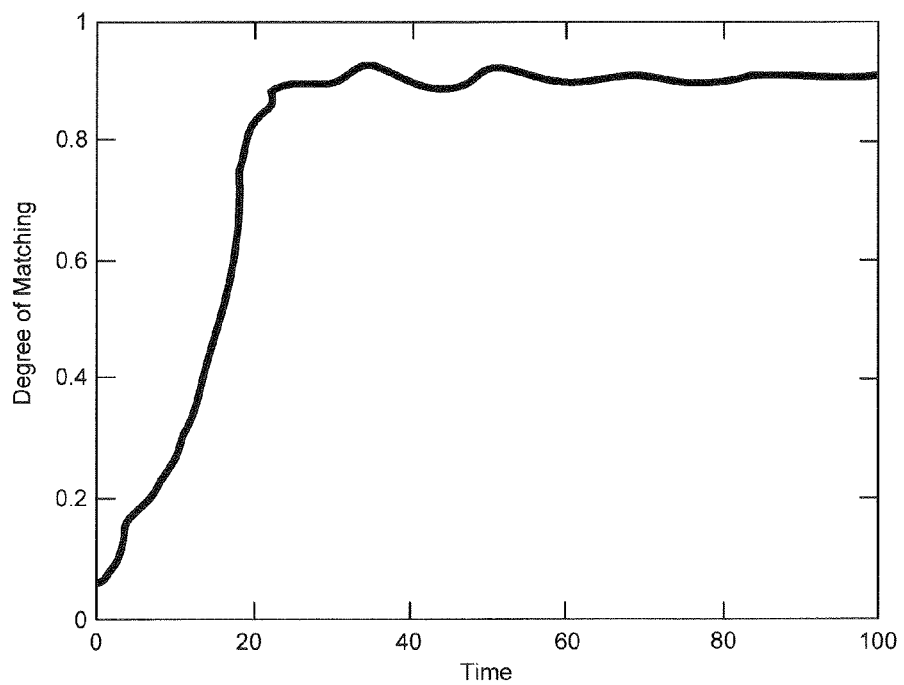

FIG. 4(a) shows phase lock settles quickly (at time of 20 inverse cyclic frequency) for a match between a target pattern and a memorized pattern and phase lock is maintained (from time 20 to time 100). FIG. 4(b) shows a voltage output from averager 320 that indicates a high degree of matching (near 1). Of note, the relative phases of oscillators (whose phases are shown in FIG. 4(a)) tend to be constant values that are not necessarily 0 or π. The degree of matching reaches a stable high value (See FIG. 4(b) from time 20 to 100).

Figure 5A:
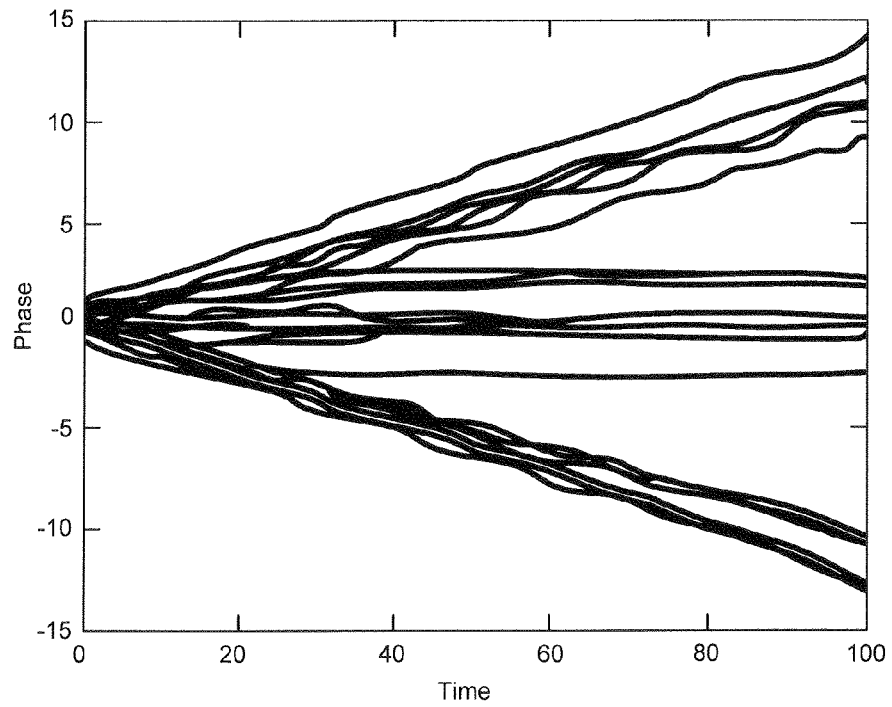
FIGS. 5(a) and 5(b) depict pattern non-matching in an embodiment of the invention.
Figure 5B:
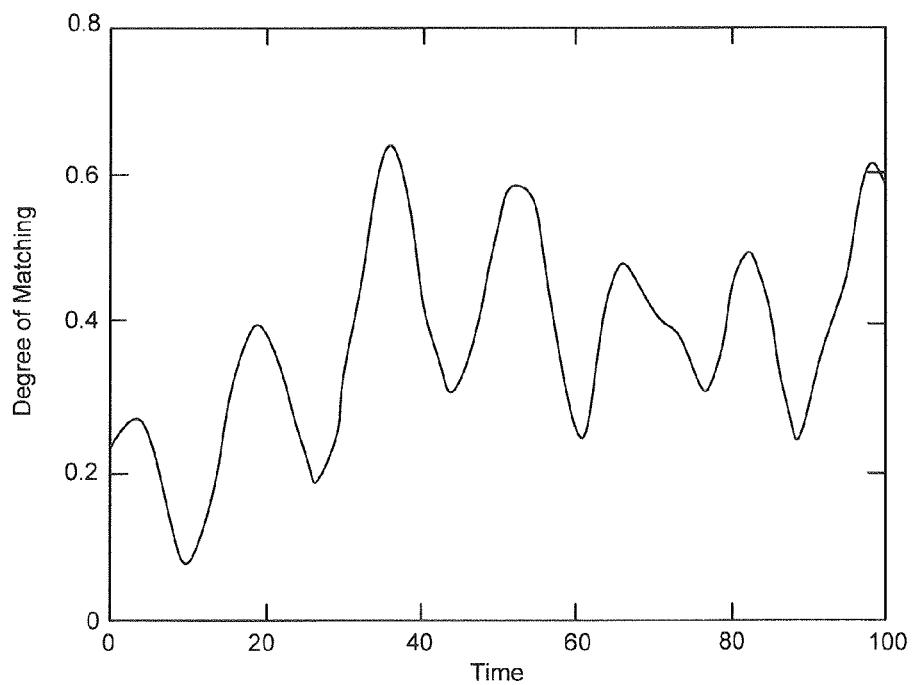

In contrast with FIGS. 4(a) and (b), FIG. 5(a) shows no phase lock settling and instead shows phase divergence for a non-match between a target pattern and a memorized pattern. In fact, the relative phases of oscillators grow out almost linearly, indicating absence of phase locking. FIG. 5(b) shows an unsteady voltage output from averager 320 that indicates a low degree of matching. Each line of FIGS. 4(a) and 5(a) is representative of a phase of an individual oscillator of an array such as array 310 of FIG. 5.

FIGS. 4(a), 4(b), 5(a), 5(b) are representative of simulations conducted as follows. AM 300 oscillators are simulated with the following equations describing the voltage evolution in an array of PLLs. The equation for the phase of the voltage-controlled oscillator (VCO):

$$\frac{d\theta_i}{dt} = \omega_i + K_0 v_{c,i}$$

and the equation for the input voltage into a VCO:

$$\tau \frac{dv_{c,i}}{dt} = -v_{c,i} + 2\varepsilon K_d V(\theta_i) \sum_{j=1}^{n} C_{ij} V(\theta_j) v_{c,i}.$$

Here $\theta_i$ is the phase of i-th VCO, $v_{c,i}$ is the ac voltage at the input of i-th VCO, t is the time, $\omega_i = \omega_0 + \Delta\omega(\xi_{0i} - \xi_{ki})$ is the frequency of the i-th VCO, n is the number of oscillators equal to the number of pixels in the pattern, $K_0$ is the gain of a VCO, $\tau^{-1}$ is the cut-off frequency of the filter in the PLL, $\varepsilon$ is the strength of coupling between oscillators, $K_d$ is the gain of the mixer in the PLL, and $V(\theta) = \cos(\theta)$ is the waveform generated by the VCO, $C_{ij}$ are coupling constants between oscillators i and j. The complex amplitude of a VCO is defined as $z_i = \exp(i\theta_i)$.

Figure 7:
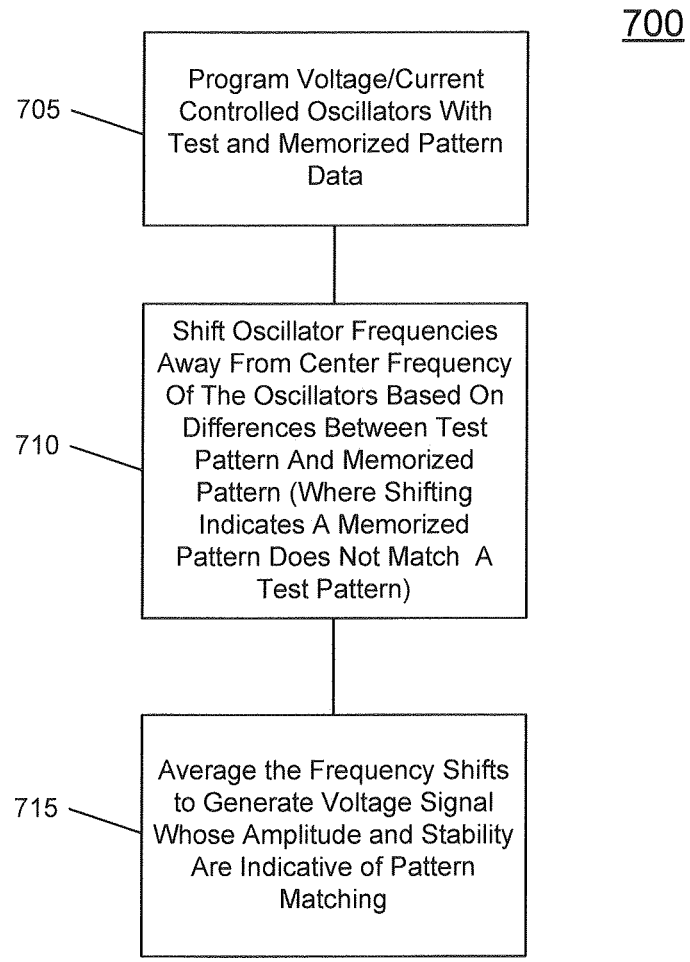
FIG. 7 includes a method for pattern matching in an embodiment of the invention.

FIG. 7 includes method 700 for pattern matching in an embodiment of the invention. In block 705 the method includes programming voltage or current controlled oscillators (by varying the voltage or current input to the oscillator controls) with test and memorized pattern data.

In block 710 the method shifts frequencies of oscillators based on a difference between a test pattern and a memorized pattern. The greater the shift away from the center frequency of the oscillator, the greater the mismatch between the two patterns.

In block 715 the method includes averaging the frequency shifts to generate voltage signals whose amplitudes and stabilities are indicative of pattern matching (e.g., a stable amplitude near a justified or scaled value of 1 indicating a match between patterns and a non-stable value below 1 indicating a mismatch or non-match between patterns).

Thus, an embodiment enables an AM with superior functionality that is much easier to implement than previous AMs. An embodiment is a single phase AM (considering the coefficients do not need to be reprogrammed as is the case in the two stage protocol for FIG. 1). An AM embodiment has no need for phase detectors (i.e., phase detectors may be included within a single oscillator, such as a PLL, but are not needed to determine matching between test and memorized patterns such as with FIG. 1). An embodiment provides "winner localization" as the amplitude of voltage from an averager. An embodiment includes no memory elements; in contrast to those required in the recognition circuit of the system of FIG. 1. (However, such an embodiment may couple to memory to store memorized memorized patterns). Also, in one embodiment control of phases of coupling is not required due to established methods to control frequency (e.g., with voltage or current controlled oscillators). Also, an embodiment works with grayscale patterns and is thus more effective for, as an example, color image recognition.

An embodiment includes an apparatus comprising: an associative memory, including first and second oscillators coupled to one another and each to couple to the at least one memory, to perform operations comprising: shifting a frequency of the first oscillator away from its center frequency by a first shift amount based on a difference between portions of first and second patterns; and shifting a frequency of the second oscillator away from its center frequency by a second shift amount based on an additional difference between additional portions of the first and second patterns; wherein the first and second oscillators synchronize phases with each other based on the first and second shift amounts. In an embodiment the first and second patterns include non-binary analog patterns having grayscale data. An embodiment comprises an averaging module coupled to the first and second oscillators to sum outputs from the first and second oscillators. In an embodiment the averaging module is to output a voltage representative of a degree of phase synchronization between the first and second oscillators. In an embodiment the averaging module includes an operational amplifier. In an embodiment the first and second oscillators include at least one of a voltage controlled oscillator and a current controlled oscillator and the first and second oscillators include at least one of a phase locked loop (PLL) oscillator, a spin torque oscillator, and a resonant body oscillator. An embodiment includes third and fourth oscillators coupled to one another and each to couple to the at least one memory, to perform operations comprising: shifting a frequency of the third oscillator away from its center frequency by a third shift amount based on a difference between portions of the first pattern and a third pattern; and shifting a frequency of the fourth oscillator away from its center frequency by a fourth shift amount based on an additional difference between additional portions of the first and third patterns; wherein the third and fourth oscillators do not synchronize phases with each other based on the third and fourth shift amounts. An embodiment comprises an averaging module coupled to the third and fourth oscillators to sum outputs from the third and fourth oscillators and to output an inconsistent voltage representative of a mismatch between the first and third patterns. An embodiment includes shifting the frequencies of the first, second, and third oscillators occur in parallel with each other. In an embodiment the operations comprise matching the first pattern to the second pattern based on the second shift amount equaling zero. In an embodiment the first and second patterns include non-binary analog patterns having grayscale data and the operations comprise shifting the frequencies of the first and second oscillators based on the grayscale data. In an embodiment the at least one memory is to include first and second coupling coefficients respectively for the first and second oscillators, the first and second coupling coefficients being equal to one another. In an embodiment the operations comprise matching the first pattern to the second pattern without using a phase detector. In an embodiment the operations comprise storing the first and second patterns in the at least one memory and the at least one memory includes analog memory.

An embodiment includes a method comprising: shifting a frequency of a first oscillator away from its center frequency by a first shift amount based on a difference between portions of first and second patterns; and shifting a frequency of a second oscillator away from its center frequency by a second shift amount based on an additional difference between additional portions of the first and second patterns; wherein (a) the first and second oscillators are coupled to one another and are included in an associative memory, and (b) the first and second oscillators synchronize phases with each other based on the first and second shift amounts. In an embodiment the first and second patterns include non-binary analog patterns having grayscale data and the method comprises shifting the first and second frequencies based on the grayscale data. An embodiment comprises summing outputs from the first and second oscillators and outputting a voltage representative of a degree of phase synchronization between the first and second oscillators.

An embodiment comprises: an associative memory, including an array of oscillators each coupled to one another and each to couple to at least one memory, to perform operations comprising: determining differences between portions of first and second patterns; and adjusting frequencies of the oscillators, based on the differences, by shift amounts; wherein the oscillators synchronize phases with each other based on the shift amounts. An embodiment comprises an averaging module to process data from the oscillators and output a voltage representative of a degree of phase synchronization between the oscillators. In an embodiment the first and second patterns both include grayscale data and the operations comprise adjusting the frequencies based on the grayscale data.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatuses for processing instructions, or one or more machine readable media including instructions that in response to being executed on a computing device, cause the device to carry out one or more of the methods and techniques described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an associative memory, including first and second oscillators coupled to one another and each to couple to at least one memory, to perform operations comprising:
   shifting a frequency of the first oscillator away from its center frequency by a first shift amount based on a difference between portions of first and second patterns; and
   shifting a frequency of the second oscillator away from its center frequency by a second shift amount based on an additional difference between additional portions of the first and second patterns;
   wherein the first and second oscillators synchronize phases with each other based on the first and second shift amounts.

2. The apparatus of claim 1, wherein the first and second patterns include non-binary analog patterns having grayscale data.

3. The apparatus of claim 1, comprising an averaging module coupled to the first and second oscillators to sum outputs from the first and second oscillators.

4. The apparatus of claim 3, wherein the averaging module is to output a voltage representative of a degree of phase synchronization between the first and second oscillators.

5. The apparatus of claim 4, wherein the averaging module includes an operational amplifier.

6. The apparatus of claim 1, wherein the first and second oscillators include at least one of a voltage controlled oscillator and a current controlled oscillator and the first and second oscillators include at least one of a phase locked loop (PLL) oscillator, a spin torque oscillator, and a resonant body oscillator.

7. The apparatus of claim 1 including third and fourth oscillators coupled to one another and each to couple to the at least one memory, to perform operations comprising:
   shifting a frequency of the third oscillator away from its center frequency by a third shift amount based on a difference between portions of the first pattern and a third pattern; and
   shifting a frequency of the fourth oscillator away from its center frequency by a fourth shift amount based on an additional difference between additional portions of the first and third patterns;
   wherein the third and fourth oscillators do not synchronize phases with each other based on the third and fourth shift amounts.

8. The apparatus of claim 7, comprising an averaging module coupled to the third and fourth oscillators to sum outputs from the third and fourth oscillators and to output an inconsistent voltage representative of a mismatch between the first and third patterns.

9. The apparatus of claim 7, wherein shifting the frequencies of the first, second, and third oscillators occur in parallel with each other.

10. The apparatus of claim 1, wherein the operations comprise matching the first pattern to the second pattern based on the second shift amount equaling zero.

11. The apparatus of claim 1, wherein the first and second patterns include non-binary analog patterns having grayscale data and the operations comprise shifting the frequencies of the first and second oscillators based on the grayscale data.

12. The apparatus of claim 1, wherein the at least one memory is to include first and second coupling coefficients respectively for the first and second oscillators, the first and second coupling coefficients being equal to one another.

13. The apparatus of claim 1, wherein the operations comprise matching the first pattern to the second pattern without using a phase detector.

14. The apparatus of claim 1, wherein the operations comprise storing the first and second patterns in the at least one memory and the at least one memory includes analog memory.

15. A method comprising:
shifting a frequency of a first oscillator away from its center frequency by a first shift amount based on a difference between portions of first and second patterns; and
shifting a frequency of a second oscillator away from its center frequency by a second shift amount based on an additional difference between additional portions of the first and second patterns; and
wherein (a) the first and second oscillators are coupled to one another and are included in an associative memory, and (b) the first and second oscillators synchronize phases with each other based on the first and second shift amounts.

16. The method of claim 15, wherein the first and second patterns include non-binary analog patterns having grayscale data and the method comprises shifting the first and second frequencies based on the grayscale data.

17. The method of claim 15, comprising summing outputs from the first and second oscillators and outputting an voltage representative of a degree of phase synchronization between the first and second oscillators.

18. An apparatus comprising:
an associative memory, including an array of oscillators each coupled to one another and each to couple to at least one memory, to perform operations comprising:
determining differences between portions of first and second patterns; and
adjusting frequencies of the oscillators, based on the differences, by shift amounts;
wherein the oscillators synchronize phases with each other based on the shift amounts.

19. The apparatus of claim 18, comprising an averaging module to process data from the oscillators and output a voltage representative of a degree of phase synchronization between the oscillators.

20. The apparatus of claim 18, wherein the first and second patterns both include grayscale data and the operations comprise adjusting the frequencies based on the grayscale data.

* * * * *